(12) United States Patent
Fujimori et al.

(10) Patent No.: US 8,461,663 B2
(45) Date of Patent: Jun. 11, 2013

(54) SEMICONDUCTOR DEVICE WITH SILICON CAPACITOR

(75) Inventors: Reiki Fujimori, Ojuya (JP); Mitsuru Soma, Higashi Matsuyama (JP)

(73) Assignees: SANYO Electric Co., Ltd., Moriguchi-shi (JP); SANYO Semiconductor Co., Ltd., Ora-gun (JP)

( * ) Notice: Subject to any disclaimer, the term of this patent is extended or adjusted under 35 U.S.C. 154(b) by 431 days.

(21) Appl. No.: 12/755,663

(22) Filed: Apr. 7, 2010

(65) Prior Publication Data

US 2010/0252910 A1 Oct. 7, 2010

(30) Foreign Application Priority Data

Apr. 7, 2009 (JP) .................................. 2009-92783

(51) Int. Cl.
*H01L 21/02* (2006.01)
(52) U.S. Cl.
USPC ..... 257/532; 257/296; 257/535; 257/E29.343
(58) Field of Classification Search
USPC .................. 257/532, 535, E29.342, E29.343
See application file for complete search history.

(56) References Cited

U.S. PATENT DOCUMENTS 8,084,800 B2 * 12/2011 Kawashima et al. ......... 257/296

FOREIGN PATENT DOCUMENTS

JP 5-90492 4/1993

* cited by examiner

*Primary Examiner* — Ha Tran T Nguyen
*Assistant Examiner* — Raj R Gupta
(74) *Attorney, Agent, or Firm* — Morrison & Foerster LLP

(57) ABSTRACT

In a conventional semiconductor device, part of a dielectric film of a capacitive element is removed when photoresist is peeled off, and this causes problems of variation in capacitance value of the capacitive element and deterioration of breakdown voltage characteristics. In a semiconductor device according to the present invention, a silicon nitride film serving as a dielectric film is formed on the top face of a lower electrode of a capacitive element, and an upper electrode is formed on the top face of the silicon nitride film. The upper electrode is formed of a laminated structure having a silicon film and a polysilicon film protecting the silicon nitride film. This structure prevents part of the silicon nitride film from being removed when, for example, photoresist is peeled off, thereby preventing variation in capacitance value of the capacitive element and deterioration of the breakdown voltage characteristics.

4 Claims, 4 Drawing Sheets

SEMICONDUCTOR DEVICE WITH SILICON CAPACITOR

This application claims priority from Japanese Patent Application Number JP 2009-92783 filed on Apr. 7, 2009, the content of which is incorporated herein by reference in its entirety.

BACKGROUND OF THE INVENTION

1. Field of the Invention

The present invention relates to a semiconductor device which is prevented from having variation in a capacitance value and deterioration of breakdown voltage characteristics, and a method of manufacturing the same.

2. Description of the Related Art

A manufacturing method described below has been known as an example of a conventional method of manufacturing a semiconductor device. FIGS. 6A and 6B are cross-sectional views for explaining the conventional method of manufacturing a semiconductor device.

As shown in FIG. 6A, an N type epitaxial layer 52 is firstly formed on a P type semiconductor substrate 51. The epitaxial layer 52 is sectioned into multiple element formation regions by isolation regions 53. An NPN transistor 54 is formed in one of the element formation regions, and a capacitive element 55 is formed on a LOCOS oxide film in another element formation region. Then, diffusion layers of the NPN transistor 54 are formed, and a lower electrode 56 of the capacitive element 55 and a silicon nitride film 57 serving as a dielectric film are formed. Thereafter, an insulating layer 58 is formed above the epitaxial layer 52. Next, in the formation region of the capacitive element 55, an opening region 59 is formed in the insulating layer 58 to expose the silicon nitride film 57 therethrough for the purpose of forming an upper electrode.

Photoresist 60 is then formed above the epitaxial layer 52. Opening regions are formed in the photoresist 60 to form electrodes of the NPN transistor 54 and a lower extraction electrode of the capacitive element 55. Then, contact holes are formed in the silicon nitride film 57 and the insulating layer 58 by etching while using the photoresist 60 as a mask.

Next, as shown in FIG. 6B, the photoresist 60 (see FIG. 6A) is peeled off by ashing, and the top face of the insulating layer 58 and the like are cleaned by using, for example, sulfuric acid. Then, the electrodes of the NPN transistor 54 and the lower extraction electrode and an upper electrode 61 of the capacitive element 55 are formed in the contact holes and the opening region 59 formed in the insulating layer 58, respectively. (This technology is described for instance in Japanese Patent Application Publication No. Hei 5-90492 (pages 3 and 4, FIGS. 4 to 7).)

SUMMARY OF THE INVENTION

As described above, the silicon nitride film 57 serving as the dielectric film is formed on the top face of the lower electrode 56 in the capacitive element 55. Then, the opening region 59 is formed in the insulating layer 58 to form the upper electrode 61, and the photoresist 60 is subsequently formed above the epitaxial layer 52. Thereafter, the contact holes are formed in the insulating layer 58, and the photoresist 60 is peeled off from the insulating layer 58 by ashing. Then, the top face of the insulating layer 58 and the like are cleaned by sulfuric acid. At this time, in the formation region of the capacitive element 55, the sulfuric acid oxides the top face of the silicon nitride film 57 disposed below the photoresist 60, and removes part of the silicon nitride film 57. The silicon nitride film 57 is similarly cleaned by a chemical solution when the opening region 59 is formed. The film thickness of the silicon nitride film 57 serving as the dielectric film becomes uneven by these cleaning steps, thereby causing a problem of variation in capacitance value. In particular, in a case where a thinner film is formed as the silicon nitride film 57 serving as the dielectric film to achieve the capacitive element 55 with higher density, the semiconductor device is affected more significantly by the oxidation of the top face of the silicon nitride film 57 and variation in film thickness thereof.

In addition to the above problem, an unreacted substance and a substance during reaction in the silicon nitride film 57 are removed by etching when the silicon nitride film 57 is cleaned with a chemical solution. Then, weak points such as pinholes are formed in the silicon nitride film 57. Such a structure causes a problem of deterioration of breakdown voltage characteristics.

The invention has been made under the aforementioned circumstances. A semiconductor device of the present invention includes a semiconductor layer, a lower electrode of a capacitive element formed on the semiconductor layer, an insulating layer formed above the semiconductor layer to cover the lower electrode, an opening region formed in the insulating layer, a dielectric film formed on the lower electrode to be in contact with the lower electrode exposed through the opening region, a first silicon film which is disposed at least on the opening region and which serves as an upper electrode of the capacitive element, and a second silicon film which covers the first silicon film and which serves as the upper electrode formed on the dielectric film. Accordingly, in the present invention, the first silicon film prevents oxidation of the top face of the dielectric film and etching of part of the dielectric film. This prevents variation in capacitance value and deterioration of breakdown voltage characteristics.

A method of manufacturing a semiconductor device of the present invention includes the steps of forming a lower electrode of a capacitive element on a semiconductor layer, then forming an insulating layer on the semiconductor layer to cover the lower electrode, and thereafter forming an opening region in the insulating layer to expose the lower electrode, forming a dielectric film on the insulating layer to cover the lower electrode exposed through the opening region, and forming a first silicon film on the dielectric film to cover the dielectric film inside the opening region, the first silicon film serving as an upper electrode of the capacitive element, and forming a second silicon film on the dielectric film to cover the first silicon film, the second silicon film serving as the upper electrode. Accordingly, in the present invention, the upper electrode has a laminated structure formed by stacking the first silicon layer and the second silicon layer. This prevents variation in film thickness of the dielectric film and formation of pinholes.

DESCRIPTION OF THE INVENTION

Figure 1A:
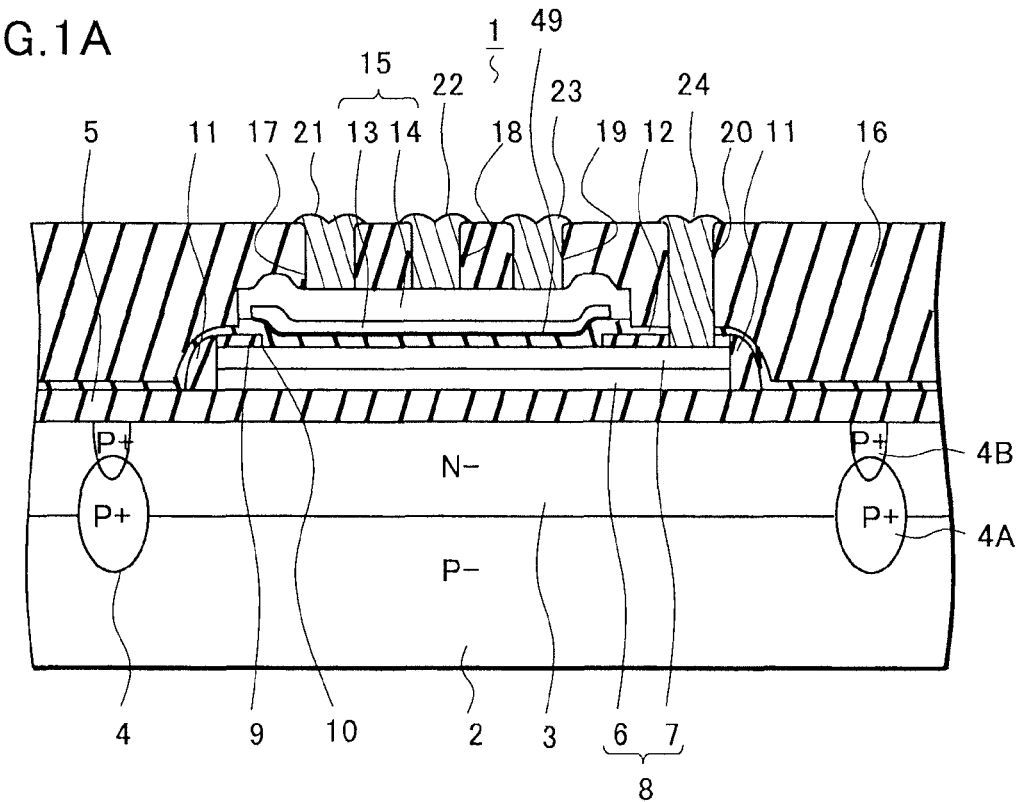
FIGS. 1A and FIG. 1B are a cross-sectional view and a plan view, respectively, for explaining a semiconductor device according to a preferred embodiment of the invention.
Figure 1B:
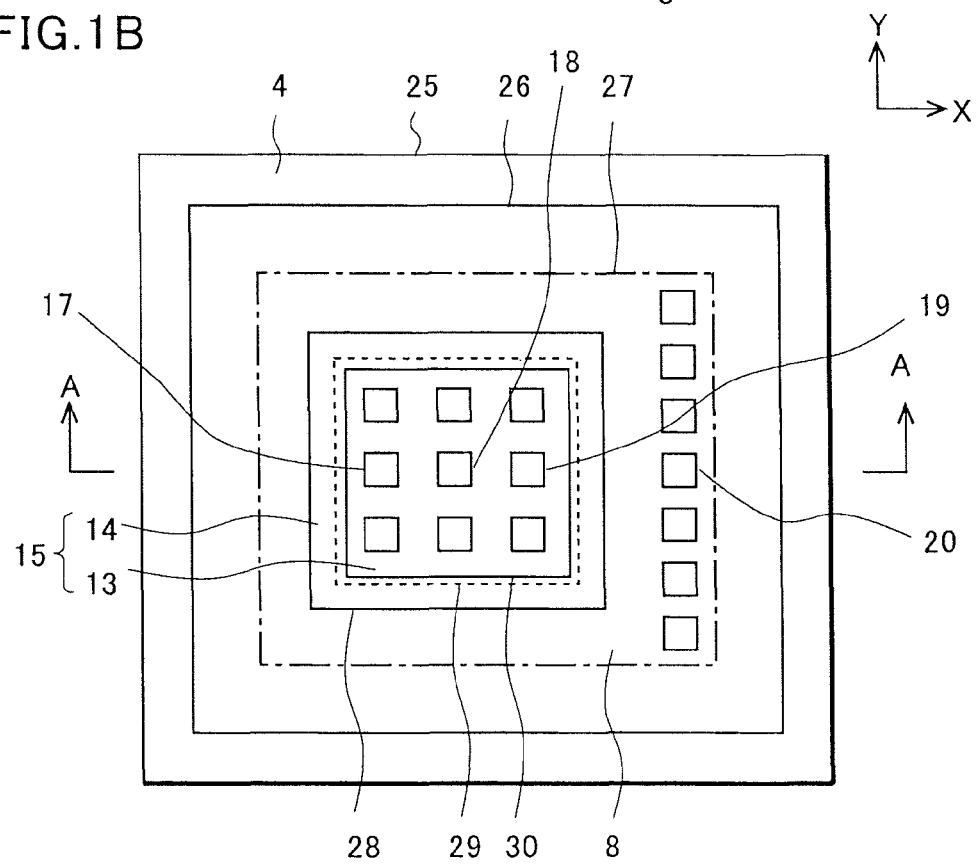

Hereinbelow, a semiconductor device, which is a first preferred embodiment of the invention, will be described in detail with reference to FIGS. 1A and 1B. FIG. 1A is a cross-sectional view for explaining a capacitive element 1, and is a cross-sectional view taken along a line A-A shown in FIG. 1B. FIG. 1B is a plan view for explaining the capacitive element 1.

As shown in FIG. 1A, an N type epitaxial layer 3 is formed on a P type single-crystal silicon substrate 2. Note that, although the single epitaxial layer 3 is formed on the substrate 2 in the present embodiment, the structure is not limited to this. For example, multiple epitaxial layers may be stacked on a top face of the substrate. The epitaxial layer 3 is sectioned into multiple element formation regions by isolation regions 4. Each of the isolation regions 4 is formed of a P type buried layer 4A and a P type diffusion layer 4B. The diffusion depth (creep-down length) of the diffusion layer 4B from a top face of the epitaxial layer 3 is shallower than the diffusion depth (creep-up length) of the buried layer 4A from the top face of the substrate 2. Accordingly, the formation region of the isolation region 4 can be made compact.

A capacitive element 1 is formed on one of the multiple element formation regions. In the formation region of the capacitive element 1, a LOCOS oxide film 5 is formed on the top face of the epitaxial layer 3. A polysilicon film 6 and a tungsten silicon film (hereinafter, referred to as WSi film) 7 is then deposited on the LOCOS oxide film 5, thereby forming a lower electrode 8. The polysilicon film 6 has a film thickness of 1000 Å, for example, and the WSi film 7 has a film thickness of 1020 Å, for example.

An insulating layer 9 is formed on a top face of the lower electrode 8, and is made of a non-doped-silicate glass (NSG) film, for example. An opening region 10 is formed in the insulating layer 9, and the lower electrode 8 is exposed through the opening region 10. In addition, a insulating spacer 11 is formed on side surfaces of the lower electrode 8 and the insulating layer 9. The insulating spacer 11 is made of for example, a tetra-ethyl-ortho-silicate (TEOS) film.

A silicon nitride film 12 is formed on the epitaxial layer 3 including a region where the lower electrode 8 is formed, and is in contact with the lower electrode 8 through the opening region 10. The silicon nitride film 12 has a film thickness of 175 Å, for example, and is used as a dielectric film in the capacitive element 1. Since the silicon nitride film 12 is formed as a thin film having the above-described film thickness, the capacitive element 1 with high density can be achieved. As shown by a bold line 49, a silicon oxide film is formed on a top face of the silicon nitride film 12 covered with a polysilicon film 13.

The polysilicon film 13 is formed above the lower electrode 8 to cover at least a region directly above the opening region 10. The polysilicon film 13 has a film thickness of 525 Å, for example. As will be described later in detail, the polysilicon film 13 prevents the silicon nitride film 12 formed in the opening region 10 from being etched and pinholes from being formed in the silicon nitride film 12. As a result, variation in film thickness of a region of the silicon nitride film 12 to be used as the dielectric film is eliminated, and thus variation in capacitance value of the capacitive element 1 is prevented. Note that the polysilicon film 13 is only required to have the following film thickness in order to prevent the silicon nitride film 12 from being etched. The polysilicon film 13 is a film thinner than a silicon film 14, and has such a film thickness that the silicon nitride film 12 is not etched in the subsequent steps by a chemical solution used for cleaning photoresist and by a chemical solution used for cleaning before deposition of the silicon film.

The silicon film 14 is formed above the lower electrode 8 to cover the polysilicon film 13. The silicon film 14 has a film thickness of 2000 Å, for example. The silicon film 14 is formed as an amorphous silicon film when being deposited. Thereafter, the silicon film 14 is subjected to heat in the subsequent manufacturing step, and transforms to a polysilicon film. An upper electrode 15 is formed to have a laminated structure of the polysilicon film 13 and the silicon film 14. Note that another process is conducted between the silicon film 14 and the polysilicon film 13, and thus a thin oxide film is formed on a top face of the polysilicon film 13. As a result, crystal orientations of the polysilicon film 13 and the silicon film 14 are slightly different from each other. Moreover, the silicon film 14 is deposited as an amorphous silicon film, and thereby the grain thereof is larger than a case where the silicon film 14 is deposited as a polysilicon film. Accordingly, the silicon film 14 has a lower resistance, and thereby the high frequency characteristics thereof are improved.

An insulating film 16 is formed above the epitaxial layer 3. The insulating film 16 is formed by stacking, for example, a TEOS film, a boron phospho silicate glass (BPSG) film, a spin on glass (SOG) film, and the like. In addition, contact holes 17 to 20 are formed in the insulating film 16. Upper extraction electrodes 21 to 23 and a lower extraction electrode 24 are formed respectively in the contact holes 17 to 20.

In FIG. 1B, a region surrounded by solid lines 25 and 26 is the formation region of the isolation region 4. A region surrounded by an alternate long and short dash line 27 is the formation region of the lower electrode 8. A region surrounded by a solid line 28 is the formation region of the silicon film 14 of the upper electrode 15. A region surrounded by a dotted line 29 is the formation region of the polysilicon film 13 of the upper electrode 15.

Firstly, as shown by the solid line 28 and the dotted line 29, in the upper electrode 15, the silicon film 14 is formed on the top face of the polysilicon film 13 to completely cover the polysilicon film 13. A solid line 30 shows the opening region 10 formed in the insulating layer 9. In a region inside the solid line 30, which is a region surrounded by the dotted line 29, nine quadrangles are shown in FIG. 1B. These nine quadrangles are the contact holes used to form the upper extraction electrodes 15. According to this structure, the top face of the polysilicon film 13 is completely covered with the silicon film 14, and flat regions in a top face of the silicon film 14 are made to be larger. In addition, a top face of the insulating layer 16 (see FIG. 1A) is made flat. As a result, the contact holes are easily formed in a region with a uniform film thickness, and the contact holes are uniformly arranged with respect to the upper electrode 15. Thus, uniform operation of the capacitive element 1 is achieved.

Moreover, as shown by the solid lines 28 and 30, the distance between the end portion of the opening region 10 and the end portion of the upper electrode 15 is made short. This reduces a parasitic capacitance occurring due to the upper electrode 15, and improves high frequency characteristics.

Furthermore, as shown by the solid line 28 and the dotted line 29, the polysilicon film 13 is completely covered with the silicon film 14. This prevents oxidation of the top face of the polysilicon film 13 during processing of the silicon film 14.

In the lower electrode 8 shown by the alternate long and short dash line 27, seven quadrangles are illustrated on the right-hand side of the drawing. These seven quadrangles are contact holes used to form the lower extraction electrodes 24. The contact holes are arranged at equal intervals in a Y-axis direction shown in the drawing. Note that, the lower extraction electrodes 24 may be formed in a surrounding manner around the silicon film 14 shown by the solid line 28. A region where the lower extraction electrodes 24 are arranged is determined in relation with the formation region of the capacitive element 1.

In the present embodiment, the upper electrode 15 has the laminated structure of the polysilicon film 13 and the silicon film 14 which is deposited as an amorphous silicon film, and then transformed into a polysilicon film. However, the preferred embodiment of the invention is not limited to this. The upper electrode 15 may have a laminated structure of amorphous silicon films, and the silicon film 14 may be deposited as a polysilicon film.

Next, with reference to FIGS. 2 to 5, a method of manufacturing a semiconductor device, which is a second preferred embodiment of the invention, will be described in detail. FIGS. 2 to 5 are cross-sectional views for explaining the method of manufacturing a semiconductor device according to the present embodiment. In the descriptions below, components which are the same as the components of the capacitive element 1 shown in FIG. 1 are denoted by the same reference numeral.

Figure 2:
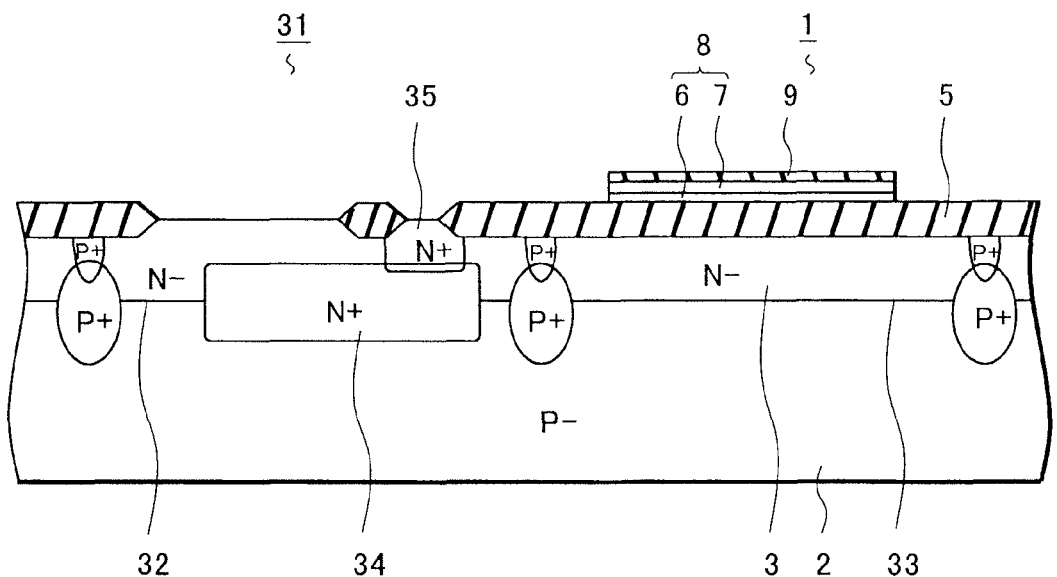
FIG. 2 is a cross-sectional view for explaining a method of manufacturing a semiconductor device according to a preferred embodiment of the invention.

Firstly, as shown in FIG. 2, a P type single-crystal silicon substrate 2 is prepared, and then an N type epitaxial layer 3 is formed on the substrate 2. Isolation regions 4 are formed in the substrate 2 and the epitaxial layer 3, and the epitaxial layer 3 is sectioned into multiple element formation regions by the isolation regions 4. An NPN transistor 31 is formed in one element formation region 32. A capacitive element 1 is formed on another element formation region 33. An N type buried layer 34 and an N type diffusion layer 35, which serve as a collector region, are then formed in the element formation region 32.

Next, LOCOS oxide films 5 are formed in certain regions of the epitaxial layer 3. Then a polysilicon film 6, a WSi film 7 and an insulating layer 9 are sequentially deposited on a top face of a corresponding one of the LOCOS oxide films 5 by a chemical vapor deposition (CVD) method. Thereafter, the polysilicon film 6, the WSi film 7 and the insulating layer 9 are selectively removed by etching to form a lower electrode 8 of the capacitive element 1 on the top face of the LOCOS oxide film 5 in the element formation region 33. Here, an NSG film is used as the insulating layer 9.

Figure 3:
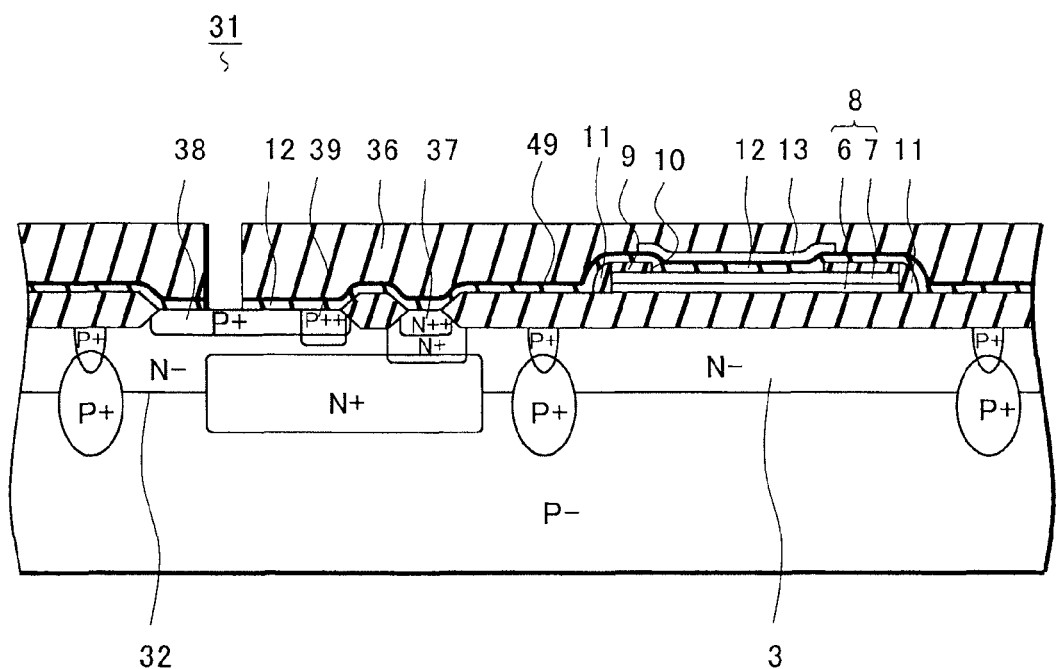
FIG. 3 is a cross-sectional view for explaining the method of manufacturing a semiconductor device according to the preferred embodiment of the invention.

As shown in FIG. 3, a TEOS film is then deposited above the epitaxial layer 3 by the CVD method. Next, the TEOS film is etched back to form insulating spacers 11 on side surfaces of the lower electrode 8 and the insulating layer 9. Thereafter, the insulating layer 9 is selectively removed by etching to form an opening region 10. Then, a silicon nitride film 12 is formed above the epitaxial layer 3 by the CVD method. Since the silicon nitride film 12 is used as a dielectric film of the capacitive element 1, the silicon nitride film 12 covers a top face of the lower electrode 8 exposed through the opening region 10. Thereafter, a polysilicon film 13 is deposited above the epitaxial layer 3 by the CVD method, and is then selectively removed by etching. In this respect, the silicon nitride film 12 is deposited, then a silicon oxide film is formed on a top face of the silicon nitride film 12 as shown by the bold line 49 in FIG. 3, and thereafter the polysilicon film 13 is deposited. The formation of the silicon oxide film causes oxidation of unreacted substance and substance undergoing reaction in the silicon nitride film 12. Thus, weak points such as pinholes are not formed, and the deterioration of breakdown voltage characteristics is prevented.

Next, photoresist 36 is formed above the epitaxial layer 3, and an opening region is subsequently formed in the photoresist 36 in a manner that the formation region of an emitter region of the NPN transistor 31 is open to the outside. Then, the silicon nitride film 12 exposed from the opening region is selectively removed by etching while using the photoresist 36 as a mask.

Note that, before the step of forming the silicon nitride film 12, an N type diffusion layer 37 serving as a collector region of the NPN transistor 31 and P type diffusion layers 38, 39 serving as a base region of the NPN transistor 31 are formed in the element formation region 32.

Figure 4:
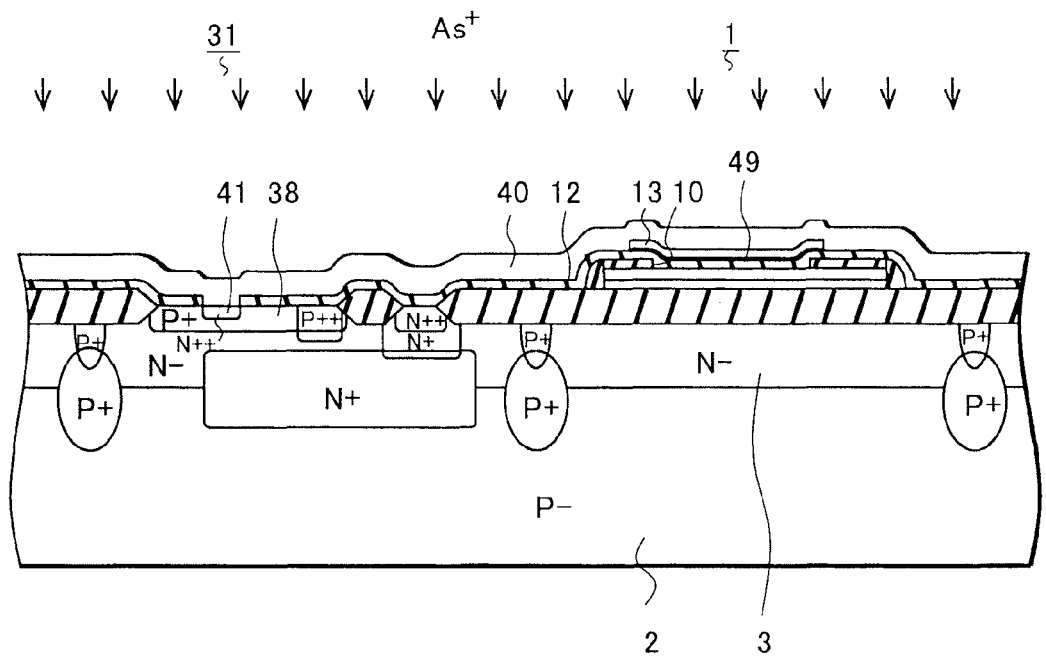
FIG. 4 is a cross-sectional view for explaining the method of manufacturing a semiconductor device according to the preferred embodiment of the invention.

Next, as shown in FIG. 4, the photoresist 36 (see FIG. 3) is peeled off and the top face of the silicon nitride film 12 and the like are cleaned. For example, the photoresist 36 on the silicon nitride film 12 is peeled off by ashing, and the top face of the silicon nitride film 12 and the like are cleaned with sulfuric acid. At this time, the polysilicon film 13 is disposed on the top face of the silicon nitride film 12 in the opening region 10 of the capacitive element 1. Accordingly, the silicon nitride film 12 can be prevented from being exposed to the sulfuric acid. Furthermore, the top face of the silicon nitride film 12 disposed in the opening region 10 is not exposed during the step of peeling off the photoresist 36 and the step of cleaning. As a result, variation in film thickness of the silicon nitride film 12 and formation of pinholes in the silicon nitride film 12 can be prevented in and around the opening region 10. In particular, in a structure like the present embodiment where a thinner film is formed as the dielectric film to achieve the capacitive element 1 with high density, variation in capacitance value can be prevented by preventing variation in film thickness of the silicon nitride film 12 and by oxidizing the top face of the silicon nitride film 12.

Next, the top face of the silicon nitride film 12 (the top face side of the epitaxial layer 3) is cleaned by, for example, hydrofluoric acid and SC1 (liquid of aqueous ammonia ($NH_4OH$), aqueous hydrogen peroxide ($H_2O_2$) and water ($H_2O$) mixed at a ratio of 1:1:5). Then, a silicon film 40 is deposited above the epitaxial layer 3 by the CVD method. An amorphous silicon film is deposited as the silicon film 40. In this cleaning step also, the polysilicon film 13 is disposed on the top face of the silicon nitride film 12 thereby preventing the silicon nitride film 12 from being exposed to the chemical solution used for the cleaning. Note that, as shown in FIG. 4, the silicon oxide film on the top face of the silicon nitride film 12 is selectively removed in the cleaning step performed before the deposition of the silicon film 40. Moreover, the ratio of mixture of the SC1 described above can be changed to various ratios in accordance with usage.

Thereafter, ions of an N type impurity, for example arsenic (As+), are implanted into the silicon film 40 at an accelerating voltage of 90 to 110 keV and at an introduction amount of $5.0 \times 10^{14}$ to $5.0 \times 10^{16}$ (per $cm^2$). Then, the silicon film 40 is selectively removed by etching while using a silicon oxide film shown in a bold line as an etching stopper film, thereby forming an emitter extraction electrode 42 (see FIG. 5) of the NPN transistor 31 and an upper electrode 15 (see FIG. 5) of the capacitive element 1. The substrate 2 is then subjected to heat treatment by being placed in an oxidizing atmosphere at 1100° C. for about 20 seconds. In the formation region of the NPN transistor 31, this heat treatment causes diffusion of the above-described impurity from the silicon film 40 into the P type diffusion layer 38 of the base region, thereby forming an N type diffusion layer 41 serving as the emitter region. Meanwhile, in the formation region of the capacitive element 1, this heat treatment causes the above-described impurity in the silicon film 40 to diffuse into the polysilicon film 13, thereby preventing depletion of the upper electrode 15. Accordingly, the voltage dependency of the capacitive element 1 is improved.

As described above, only the silicon film 40 is selectively removed and the upper electrode 15 is formed. Here, the polysilicon film 13 is completely covered with the silicon film 40. In this method of manufacturing, steps of the upper electrode 15 have a height substantially equal to the film thickness of the silicon film 40, and the region of each of the steps is prevented from having a steep angle. For example, when the polysilicon film 13 and the silicon film 40 are selectively processed at the same time, the step has a height of 2500 Å. Meanwhile, the height of the step is suppressed to about 2000 Å in the present embodiment.

Furthermore, a silicon oxide film may be formed between the polysilicon film 13 and the silicon film 40, because the silicon films 13 and 14 are not formed at one deposition step. For example, when the polysilicon film 13 and the silicon film 40 are selectively processed at the same time, variation in etching occurs due to a difference in an etching rate in the silicon oxide films. However, only the silicon film 40 is selectively removed in the present embodiment. This prevents variation in etching thereby preventing variation in capacitance value of the capacitive element 1 due to variation in film thickness.

Accordingly, in the upper electrode 15, an oxide film may exist at an interface between the polysilicon film 13 and the silicon film 14. This oxide film is balled up in the heat treatment step and conduction is achieved. In addition, as illustrated, part of the silicon nitride film 12 is over etched when the silicon film 40 is etched.

Figure 5:
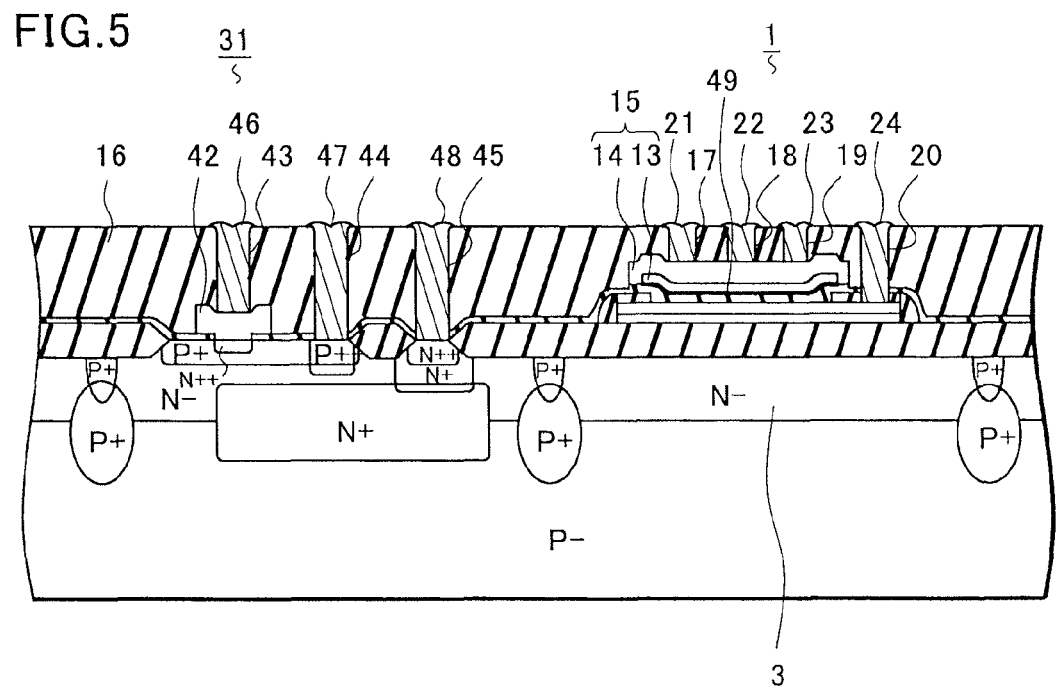
FIG. 5 is a cross-sectional view for explaining the method of manufacturing a semiconductor device according to the preferred embodiment of the invention.
Figure 6A:
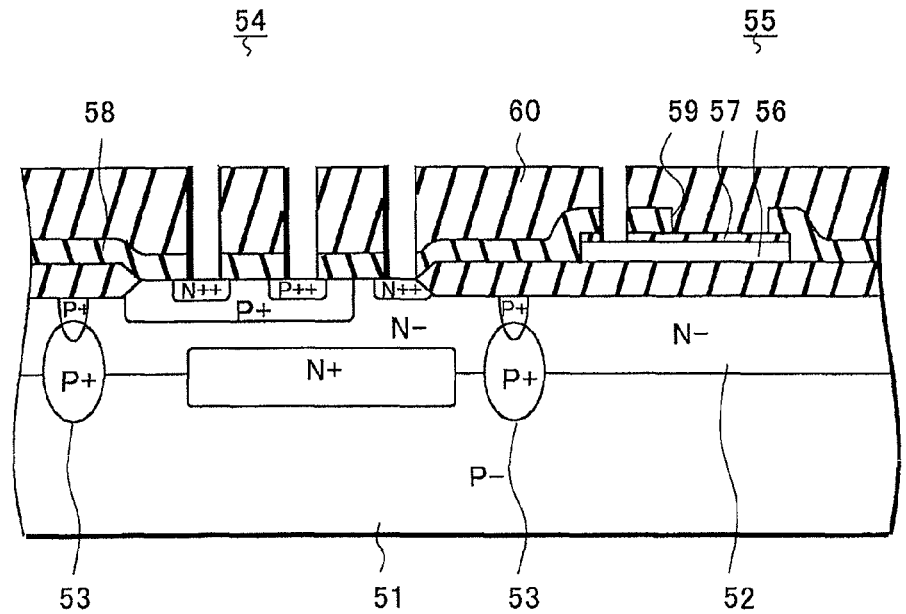
FIG. 6A and FIG. 6B are cross-sectional views for explaining a method of manufacturing a semiconductor device according to a conventional embodiment.
Figure 6B:
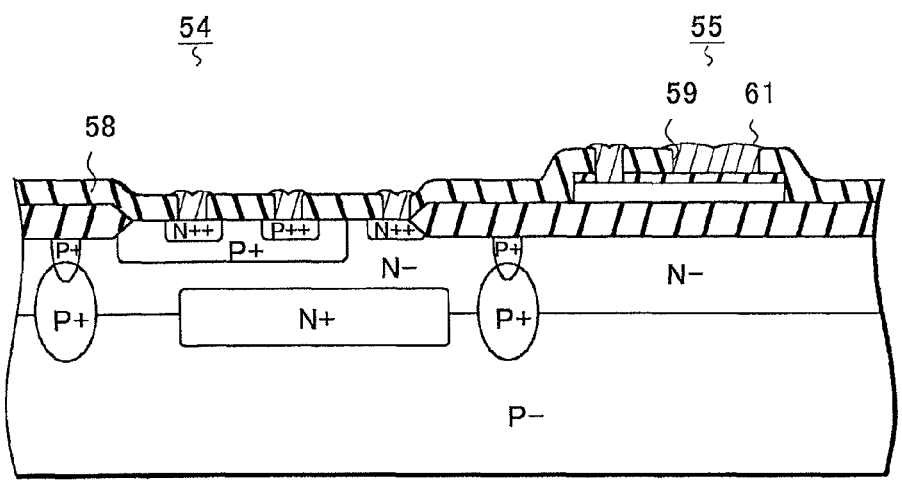

Next, as shown in FIG. 5, the insulating film 16 is formed above the epitaxial layer 3. The insulating film 16 is formed by stacking, for example, a TEOS film, a BPSG film, a SOG film, and the like. Then, contact holes 17 to 20 and 43 to 45 are formed in the insulating film 16. Upper extraction electrodes 21 to 23, a lower extraction electrode 24, an emitter electrode 46, a base electrode 47, and a collector electrode 48 are formed respectively in the contact holes 17 to 20 and 43 to 45.

The present embodiment has been described the method in which ions of an impurity are not implanted into the polysilicon film 13. However, the method is not limited only to this. For example, ions of an N type impurity, for example boron fluoride ($BF_2+$), may be directly implanted into the silicon film 14, and thereafter the silicon film 14 may be deposited on the polysilicon film 13. The depletion of the upper electrode 15 is prevented also in this case, and the voltage dependency of the capacitive element 1 is improved. Additionally, other various changes can be made without departing from the gist of the preferred embodiment of the invention.

In the preferred embodiment of the invention, the upper electrode has the laminated structure of silicon films, thereby preventing variation in film thickness of the dielectric film. This structure prevents the variation in capacitance value of the capacitive element.

In the preferred embodiment of the invention, the dielectric film is prevented from being exposed to a chemical solution. Thus, formation of pinholes in the dielectric film is prevented and the deterioration of the breakdown voltage characteristics is prevented In the preferred embodiment of the invention, the flatness of the top face of the upper electrode is improved, thereby allowing easy formation of the contact holes in the upper electrode of the laminated structure, the contact holes being located on the top face of the upper electrode.

In the preferred embodiment of the invention, at least two silicon films are stacked to form the upper electrode. This manufacturing method prevents part of the dielectric film from being removed by chemical solutions used in other manufacturing steps, and thus prevents variation in film thickness of the dielectric film and formation of pinholes.

In the preferred embodiment of the invention, the emitter extraction electrode of the NPN transistor and the upper electrode of the capacitive element can be formed in a single step. Thus, the manufacturing cost can be reduced.

In the preferred embodiment of the invention, in the upper electrode of the laminated structure, the impurity is diffused in the upper electrode. This improves the voltage dependency of the capacitive element.

What is claimed is:

1. A semiconductor device comprising:
   a semiconductor layer; and
   a capacitor element disposed on the semiconductor layer, the capacitor element comprising a lower electrode formed on the semiconductor layer, an insulating layer covering the lower electrode and having an opening to expose the lower electrode, a dielectric film formed on the insulating layer so as to be in contact with the lower electrode exposed through the opening, a first silicon film formed on the dielectric film disposed in the opening and a second silicon film covering the first silicon film, and the first and second silicon films being configured to operate as an upper electrode of the capacitor element,
   wherein the first silicon film is disposed between the dielectric film and the second silicon film, and
   the second silicon film covers a side edge of first silicon film so as to be in contact with the dielectric film.

2. The semiconductor device of claim 1, wherein the first silicon film is thinner than the second silicon film, and the first silicon film has a film thickness enough to prevent a chemical solution to peel off photoresist from reaching the dielectric film.

3. The semiconductor device of claim 1, wherein the second silicon film covers a side edge of first silicon film so as to be in contact with the dielectric film.

4. The semiconductor device of claim 1, wherein the dielectric film comprises a silicon nitride film and an oxide film formed on the silicon nitride film.

* * * * *